(12) United States Patent  
Takada

(10) Patent No.: US 8,198,796 B2  
(45) Date of Patent: Jun. 12, 2012

(54) TRANSPARENT ELECTRODE AND PRODUCTION METHOD OF SAME

(75) Inventor: Hiroshi Takada, Hachioji (JP)

(73) Assignee: Konica Minolta Holdings, Inc., Tokyo (JP)

(*) Notice: Subject to any disclaimer, the term of this patent is extended or adjusted under 35 U.S.C. 154(b) by 0 days.

(21) Appl. No.: 12/933,665

(22) PCT Filed: Jul. 16, 2009

(86) PCT No.: PCT/JP2009/062874
§ 371 (c)(1),
(2), (4) Date: Sep. 20, 2010

(87) PCT Pub. No.: WO2010/010838
PCT Pub. Date: Jan. 28, 2010

(65) Prior Publication Data
US 2011/0018424 A1 Jan. 27, 2011

(30) Foreign Application Priority Data
Jul. 25, 2008 (JP) ................................. 2008-192042

(51) Int. Cl.
H01J 1/02 (2006.01)
(52) U.S. Cl. ........................ 313/352; 428/141; 428/457
(58) Field of Classification Search .................. 313/309, 313/310, 352; 428/141, 457
See application file for complete search history.

(56) References Cited

U.S. PATENT DOCUMENTS
6,914,372 B1* 7/2005 Akiyama et al. ............. 313/309
2007/0074316 A1 3/2007 Alden et al.
2007/0153353 A1 7/2007 Gruner
2009/0117327 A1* 5/2009 Takada .......................... 428/141
2009/0130433 A1 5/2009 Takada
2009/0272560 A1 11/2009 Tokunaga FOREIGN PATENT DOCUMENTS
| JP | 06-080422 A | 3/1994 |
| JP | 06-273964 A | 9/1994 |
| JP | 2004-220907 A | 8/2004 |
| JP | 2006-085916 A | 3/2006 |

(Continued)

OTHER PUBLICATIONS

Petition (in English) to submit printed publications; Patent Application No. 2010-521685; Jun. 22, 2011.

Jianfeng Li, et al.: Organic Light-Emitting Diodes Having Carbon Nanotube Anodes; American Chemical Society Nano Letters; 2006, vol. 6, No. 11; 2472-2477.

(Continued)

Primary Examiner — Vip Patel
(74) Attorney, Agent, or Firm — Holtz, Holtz, Goodman & Chick, PC

(57) ABSTRACT

Disclosed are: a transparent electrode with excellent optical transparency, electrical conductivity, and surface smoothness and is capable of providing lightness in weight and flexibility, comprising a transparent conductive layer on a transparent substrate, wherein the transparent conductive layer contains a conductive fiber and a transparent conductive material, the surface of the transparent conductive layer is composed of the conductive fiber and the transparent conductive material, and the smoothness (Ry) of the surface of the transparent conductive layer is greater than or equal to 1 nm and less than or equal to 50 nm; and a production method of same, and the present invention may provide a light emitting element with excellent uniformity of light emission.

5 Claims, 1 Drawing Sheet

FOREIGN PATENT DOCUMENTS

| | | |
|---|---|---|
| JP | 2009-505358 A | 2/2009 |
| JP | 2009-205924 A | 9/2009 |
| JP | 2009-231029 | 10/2009 |
| WO | WO 2004/069736 A2 | 8/2004 |
| WO | WO 2009/054273 A1 | 4/2009 |

OTHER PUBLICATIONS

Jung-Yong Lee, et al.: Solution-Processed Metal Nanowire Mesh Transparent Electrodes; American Chemical Society Nano Letters; 2008, vol. 8, No. 2; 689-692.

* cited by examiner

TRANSPARENT ELECTRODE AND PRODUCTION METHOD OF SAME

This application is the United States national phase application of International Application PCT/JP2009/062874 filed Jul. 16, 2009.

TECHNICAL FIELD

The present invention relates to transparent electrodes which are suitably employable in various fields, such as liquid crystal display elements, organic light emitting elements, inorganic electroluminescence elements, solar cells, electromagnetic wave shields, electronic papers and touch panels, and have high conductivity and transparency and additionally excellent smooth properties. In addition, the present invention relates to a transparent electrode production method capable of reducing greatly the production cost of the transparent electrodes having the above features.

BACKGROUND ART

In recent years, along with the rise of a demand for thin-screen TVs, developed have been various types of display techniques, such as liquid crystals, plasma, organic electroluminescence, and field emission. In any one of these displays different in display type, such a transparent electrode is an essential structural element. Further, in addition to such a display, in the fields of touch panels, cellular phones, electronic paper, various solar cells and various electroluminescence control elements, the transparent electrode have become an indispensable technical element.

Conventionally, as such a transparent electrode, mainly used has been an ITO transparent electrode in which an indium-tin complex oxide (ITO) film is formed on a transparent base material, such as glass and a transparent plastic film by a vacuum deposition method or a sputtering method. However, there are the following problems. Since the productivities of the transparent electrodes produced by the vacuum deposition method and the sputtering method are not good, their production costs become high, and since the produced transparent electrodes are inferior in flexibility, they cannot be employed for devices required such flexibility.

For the above problems, proposed is a method of forming a transparent electrode by coating metal oxide particles, such as ITO (for example, refer to Patent Document 1). However, the method has another problem that the transparent electrode cannot obtain sufficient conductivity to function as an electrode. Although the application of baking treatment to the coating layer of metal oxide particles makes it possible to lower a resistance value, the baking treatment cannot be applied to the case that a transparent electrode is formed on a resin base material such as a plastic film.

In order to provide a transparent electrode excellent in productivity, proposed is a method of forming a transparent electrode by coating or printing a coating liquid in which a conductive polymer material represented by π-conjugated polymers is dissolved or dispersed in an appropriate solvent (for example, refer to Patent Document 2). However, as compared with the metal oxide transparent electrode such as the ITO film by the vacuum deposition method, this method has another problem that the transparent electrode has low conductivity and inferior transparency.

Further, disclosed is a technique to employ conductive fibers such as carbon nanotubes (CNT) and metal nanowires, and proposed is an electrode structured such that apart of conductive fibers is fixed with a transparent resin film to a base material and a part of the conductive fibers is protruded from the transparent resin film (for example, refer to Patent Documents 3 and 4). However, the electrode with the above structure has conductivity only on the part where the conductive fibers are protruded. Therefore, the electrode has not a function as a plane electrode. In addition, since the conductive fibers are protruded from the surface, there is a problem that the electrode cannot be applied to technical usage for which the surface smoothness of an electrode is required.

PRIOR ART DOCUMENT

Patent Document

Patent documents 1: Japanese Unexamined Patent Publication No. 6-80422 official report
Patent documents 2: Japanese Unexamined Patent Publication No. 6-273964 official report
Patent documents 3: Japanese Unexamined Patent Publication No. 2006-519712 official report
Patent documents 4: US2007/0074316A1

Problems to be Solved by the Invention

As described above, the methods and techniques proposed conventionally were not able to solve the problems in obtaining a transparent electrode satisfying various kinds of characteristics. Therefore, an object of the present invention is to provide a transparent electrode that is excellent in light transmittance, electric conductivity, and surface smoothness, in addition, and can also realize lightweight properties and flexibility, and to provide a production method of such a transparent electrode.

Furthermore, another object of the present invention is to provide a transparent electrode for a light emitting element which is excellent in evenness of light emission, and to provide a production method of such a transparent electrode.

Means for Solving the Problems

As described above, the conventional techniques which employed conductive polymers or metal oxide particles as the transparent conductive material of a transparent electrode, were not able to obtain the conductivity equivalent to that of an ITO transparent electrode. In contrast, the present inventors found that even in the case that conductive polymers or metal oxide particles are used as the transparent conductive material similarly to the conventional techniques, if a transparent electrode contains conductive fibers in addition to the transparent conductive material, it becomes possible to obtain the conductivity equivalent to that of an ITO transparent electrode produced by the vacuum deposition method, whereby the present inventors resulted in the present invention.

In the transparent electrode of the present invention, even in the case where a conductive polymer and metallic oxide particles that are inferior in conductivity are used as a transparent conductive material, the conductivity equivalent to an ITO transparent electrode can be acquired. It is considered as the reasons that an electric conductive network structure formed by conductive fibers functions as a microscopic auxiliary electrode in the transparent conductive material.

Generally, such an auxiliary electrode is a wiring structure provided to lower the resistance of an electrode with insufficient conductivity. In the wiring structure, a metallic material excellent in conductivity is used by being shaped in the form of, for example, a grid by methods, such as etching, electrolytic plating, and printing. In the case where an auxiliary electrode is arranged to overlap on a transparent electrode, in order to suppress the lowering of the transmittance, it is preferable that the line width of the auxiliary electrode is thinner. However, with the problem in the working accuracy of the above conventional technique, the line width is limited to several µm to several tens µm. Therefore, the auxiliary electrode structure based on the conventional technique is a factor to reduce the transparency of a transparent electrode greatly. For example, it is said that the auxiliary electrode structure used in a plasma display panel reduces the transmittance of the panel by about 10%.

In contrast, in the transparent electrode of the present invention, it is considered that with the introducing of conductive fibers, such as metal nanowires and carbon nanotubes, into a transparent electrode, the network structure of the conductive fibers functions as an auxiliary electrode, whereby conductivity can be improved. Further, since the structure of the auxiliary electrode employing the network structure of the conductive fibers is microscopic and dense as compared with the structure of the auxiliary electrode by the conventional technique, even if a transparent conductive material inferior in conductivity is used, it becomes possible to improve conductivity dramatically. Furthermore, the employment of conductive fibers with a width of nm size makes it possible to avoid the lowering of transmittance.

Moreover, different from the electrode of the conventional technique formed such that a part of conductive fibers protrudes from the surface of a transparent resin film, in the present invention, a transparent conductive layer with the abovementioned structure is formed on a mold release surface of a smooth mold-releasing base material, and then the transparent conductive layer is transferred on a transparent base material, whereby a transparent electrode is formed. Accordingly, even if the transparent electrode contains conductive fibers, it becomes possible to obtain a smooth electrode surface and since the surface of the transparent electrode is structured with the conductive fibers and the transparent conductive material, the surface of the transparent electrode can function as a surface electrode.

Namely, as a result of earnest study to overcome the problems in the conventional technique, the inventors found that when a transparent electrode is formed in such a way that a transparent conductive layer containing conductive fibers and a transparent conductive material is formed on a mold release surface of a mold-releasing base material with the smoothness of the mold release surface being $1 \text{ nm} \leq Ry \leq 50 \text{ nm}$, and thereafter the transparent conductive layer is transferred onto a transparent base material, the resultant transparent electrode is excellent in light transmittance, conductivity, and surface smoothness so that a transparent electrode to solve the problems of the present invention can be realized. Further, when a transparent resin film is employed as the transparent base material, it becomes possible to obtain a transparent electrode which satisfies lightweight properties and flexibility.

With the acquiring of the abovementioned knowledge, the present inventors resulted in the present invention. Namely, the abovementioned objects of the present invention can be attained by the following means.

1. In a transparent electrode comprising a transparent conductive layer on a transparent base material, the transparent electrode is characterized in that the transparent conductive layer contains conductive fibers and a transparent conductive material, the surface of the transparent conductive layer is structured with conductive fibers and a transparent conductive material, and the smoothness of the surface of the transparent conductive layer is $1 \text{ nm} \leq Ry \leq 50 \text{ nm}$.

Herein, Ry represents a maximum height (the level difference between a peak portion and a valley portion on a surface) and is a value corresponding to a surface roughness specified in JIS B601 (1994).

2. The transparent electrode described in the above 1 is characterized in that the above-mentioned conductive fibers are at least one kind selected from a group of metal nanowires and carbon nanotubes.

3. The transparent electrode described in the above 1 or 2 is characterized in that the abovementioned transparent conductive material is at least one kind selected from a group of conductive polymer and conductive metal oxide particles.

4. The transparent electrode described in any one of the above 1 to 3 is characterized in that the arithmetic average roughness Ra of the surface of the transparent conductive layer is $0.1 \leq Ra \leq 5 \text{ nm}$.

Herein, Ra represents an arithmetic average roughness and is a value corresponding to a surface roughness specified in JIS B601 (1994).

5. In a transparent electrode producing method of producing the transparent electrode described in any one of the above 1 to 4, the transparent electrode producing method is characterized in that the transparent conductive layer containing the conductive fibers and the transparent conductive material is formed on a mold release surface of a mold releasing base material with the smoothness of the mold release surface being $1 \text{ nm} \leq Ry \leq 50 \text{ nm}$, and thereafter the transparent conductive layer is transferred onto a transparent base material so that a transparent electrode is formed.

Herein, Ry represents a maximum height (level difference between a peak portion and a valley portion on a surface) and is a value corresponding to a surface roughness specified in JIS B601 (1994).

EFFECTS OF THE INVENTION

According to the above-mentioned structures of the present invention, it becomes possible to obtain a transparent electrode which has features, such as high light transmittance, low surface resistivity, and high surface smoothness, and also is excellent in lightweight capabilities and flexibility, and as the effects, it becomes possible to provide a transparent electrode which can be preferably applied to technical usages, such as electric current driving type optoelectronics devices and organic EL device which require low surface resistivity and high smoothness of an electrode surface, and mobile optoelectronics device which require lightweight capabilities and flexibility. Further, in the production of the transparent electrode of the present invention, since vacuum film formation as with the conventional ITO electrode is not required, productivity can be improved, and since energy consumption is also little, adaptability to environment is also excellent.

Furthermore, the abovementioned structures of the present invention can provide an transparent electrode for a light emitting element excellent in evenness of light emission and the production method of the transparent electrode.

EMBODIMENT FOR CARRYING OUT THE INVENTION

Figure 1A:
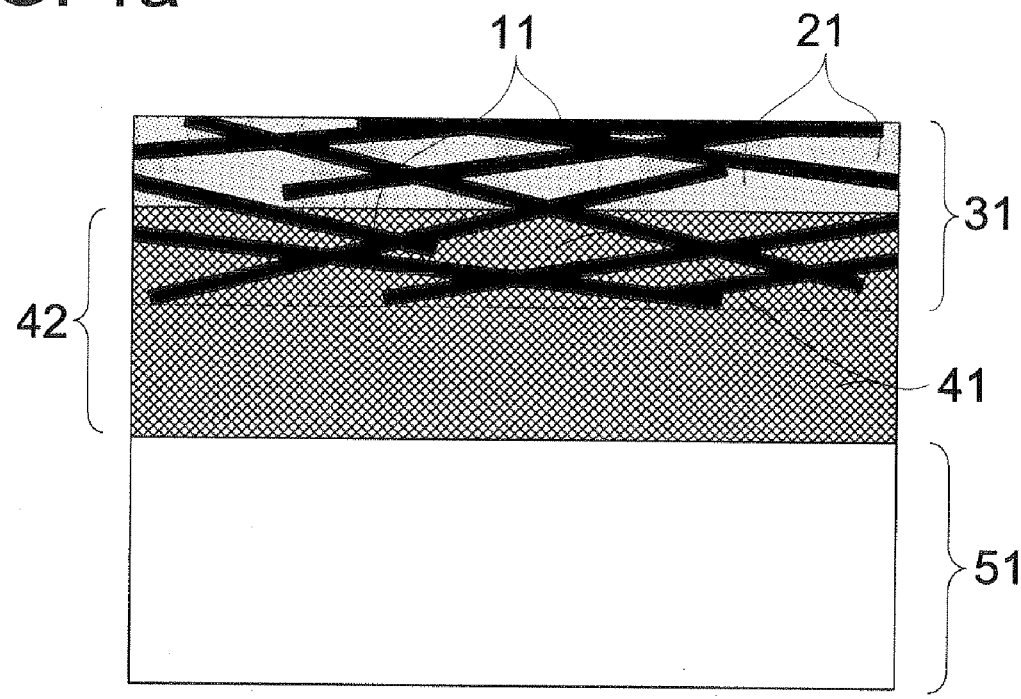
FIG. 1 is a structural schematic diagram of a transparent electrode of the present invention.

The present invention will be explained in more detail.

The transparent electrode of the present invention is a transparent electrode comprising a transparent conductive layer on a transparent base material, the transparent electrode has the feature that the transparent conductive layer contains conductive fibers and a transparent conductive material, the surface of the transparent conductive layer is structured with conductive fibers and a transparent conductive material, and the smoothness of the surface of the transparent conductive layer is 1 nm$\leq$Ry$\leq$50 nm. This feature is a technical feature common to the invention according to items 1 to 5.

The expression "the surface of the transparent conductive layer is structured with conductive fibers and a transparent conductive material" means that the surface of the transparent conductive layer is structured to comprise conductive fibers and a transparent conductive material, and the surface comprises regions composed of conductive fibers and regions composed of a transparent conductive material.

In the present invention, "transparent" means that a total light transmittance in a visible light wavelength range is 60% or more, wherein the transmittance is measured by the method specified in "Test method of total light transmittance of a plastic transparent material" in JIS K 7361-1 (corresponding to ISO 13468-1).

Preferable embodiments of the present invention, include that the conductive fibers are at least one kind selected from a group of metal nanowires and carbon nanotubes, the transparent conductive material is at least one kind selected from a group of conductive polymer and conductive metal oxide particles, and the arithmetic average roughness Ra of the surface of the transparent conductive layer is 0.1$\leq$Ra$\leq$nm.

As a producing method of the transparent electrode of the present invention, preferable is a method of forming a transparent electrode in such a way that a transparent conductive layer containing conductive fibers and a transparent conductive material is formed on a mold release surface of a mold releasing base material with the smoothness of the mold release surface being 1 nm$\leq$Ry$\leq$50 nm, and thereafter the transparent conductive layer is transferred onto a transparent base material so that the transparent electrode is formed.

Hereafter, the present invention, its structural elements and the best mode for carrying out the present invention will be explained in detail.

[Transparent Base Material]

The transparent base materials employed in the present invention are not specifically limited as long as the transparent base materials exhibit high optical transparency. For example, as appropriate base materials, glass base materials, resin base materials, and resin films may be employable from the viewpoint of excellent hardness and easy formation of a conductive layer on their surfaces. However, from the viewpoint low weight and high flexibility, it is preferable to employ the transparent resin films.

Transparent resin films preferably employed as the transparent base materials in the present invention are not specifically limited, and their materials, shape, structure and thickness may be selected from those known in the art. Examples of the transparent resin films includes: polyester film (e.g., polyethylene terephthalate (PET) film, polyethylene naphthalate film, modified polyester film), polyolefin film (e.g., polyethylene (PE) film, polypropylene (PP) film, polystyrene film, cycloolefin resin film), vinyl resin film (e.g., polyvinyl chloride film, polyvinylidene chloride film), polyether ether ketone (PEEK) film, polysulfone (PSF) film, polyethersulfone (PES) film, polycarbonate(PC) film, polyamide film, polyimide film, acrylic film, triacetyl cellulose (TAC) film. If the resin films have a transmittance of 80% or more in the visible wavelength range (380 to 780 nm), they are preferably applicable to the transparent resin film of the present invention. Among them, from a viewpoint of transparency, heat resistance, easy handling, strength and cost, preferable examples include: a biaxially-stretched polyethylene terephthalate film, a biaxially-stretched polyethylene naphthalate film, a polyethersulfone film, and a polycarbonate film. More preferable examples include: biaxially-stretched polyethylene terephthalate film and a biaxially-stretched polyethylene naphthalate film.

In order to secure the wettability and adhesive properties of a coating liquid, the transparent base material used for the present invention may be subjected to surface treatment or may be provided with an easily adhesive layer. A well-known technique can be used for the surface treatment or the easily adhesive layer. Examples of the surface treatment include: surface activating treatments, such as corona discharge treatment, flame treatment, ultraviolet treatment, high-frequency wave treatment, glow discharge process, active plasma treatment and laser treatment Examples of the materials of the easily adhesive layer include: polyester, polyamide, polyurethane, vinyl copolymer, butadiene copolymer, acrylic copolymer, vinylidene copolymer and epoxy copolymer. In the case where a transparent resin film is a biaxially-stretched polyethylene terephthalate film, it is preferable to make the refractive index of the easily adhesive layer adjoining the transparent resin film to be 1.57 to 1.63, because it becomes possible to reduce the interface reflection between the film base material and the easily adhesive layer and to improve the transmittance. Such a refractive index can be adjusted in such a way that the ratio of oxide sol having a comparatively high refractive index, such as a tin oxide sol and a cerium oxide sol and the binder resin is appropriately adjusted, and the resultant mixture is coated the easily adhesive layer on the film base material. The easily adhesive layer may be a single layer. However, in order to enhance adhesive properties, the easily adhesive layer may made two or more layers. Further, a barrier coat layer may be formed beforehand on the transparent base material, and a hard coat layer may be formed beforehand on the surface of the transparent base material opposite to the surface on which a transparent conductive layer is transferred.

[Transparent Electrode]

The structural schematic diagram of the transparent electrode of the present invention is shown in FIG. 1. The transparent electrode of the present invention is characterized in that the transparent electrode comprises a transparent conductive layer 31 provided on a transparent base material 51, and the surface of this transparent conductive layer 31 is structured with conductive fibers 11 and a transparent conductive material 21. However, the transparent electrode is not limited in terms of the other structures. For example, as shown in FIG. 1, the transparent electrode may comprise a transparent binder layer 42 composed of a transparent binder 41.

In the example of FIG. 1(a), the transparent conductive material 21 exists in the clearance at the electrode surface side in a three-dimensional mesh structure (electric conductive network structure) formed by the conductive fibers 11. The conductive fibers 11 constitute the surface of the electrode together with the transparent conductive material 21, and also can function as an auxiliary electrode of the transparent conductive material 21. Further, a transparent binder layer 42 exists between the transparent base material 51 and the clearance at the transparent base material 51 side in the three-dimensional mesh structure of the conductive fibers 11 so that the transparent conductive layer 31 is fixed to the transparent base material 51.

Figure 1B:
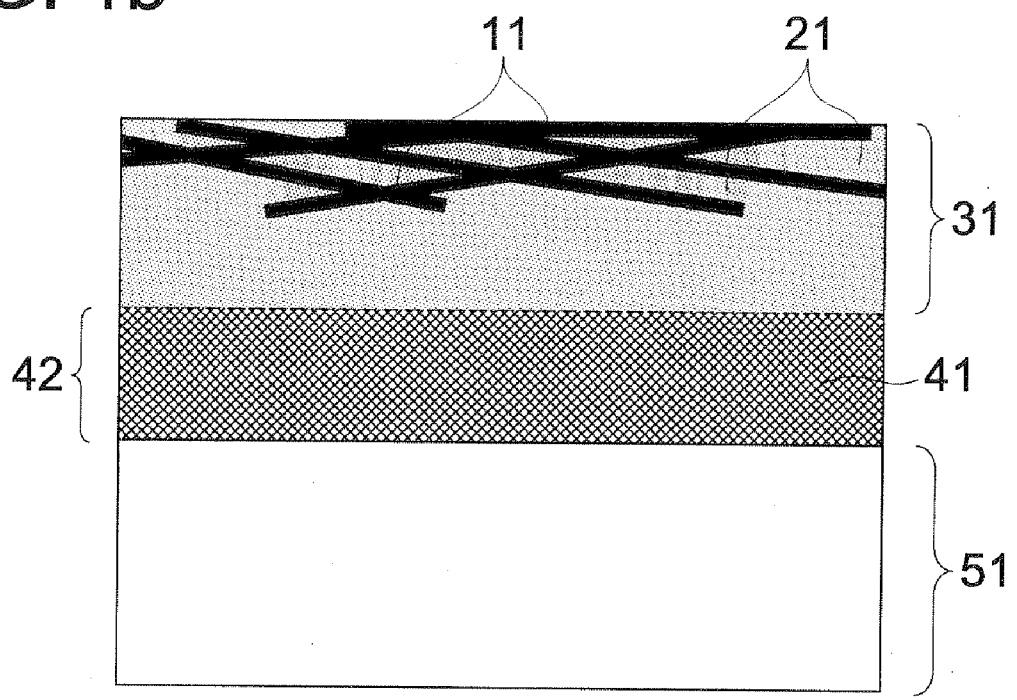

In the example of FIG. 1(b), the transparent conductive material 21 exists so as to wrap and include the three-dimensional mesh structure formed of the conductive fibers 11. The conductive fibers 11 constitute the surface of the electrode together with the transparent conductive material 21, and also can function as an auxiliary electrode of the transparent conductive material 21. Further, a transparent binder layer 42 exists between the transparent conductive material 21 and the transparent base material 51 so that the transparent conductive layer 31 is fixed to the transparent base material 51. In this case, a transparent binder layer 42 does not exist between the transparent conductive material 21 and the transparent base material 51, and the transparent conductive material 21 may come in contact with the transparent base material 51.

Here, in any example, a transparent base material 51 may be subjected to surface treatment as mentioned above, or may be provided with various functional layers in accordance with the object.

The total light transmittance of the transparent electrode of the present invention is preferably 60% or more, it is more preferably 70% or more, but it is still most preferably 80% or more. The total light transmittance can be measured in accordance with methods known in the art by the use of a spectrophotometer. Further, the electrical resistance value of the transparent conductive layer of the transparent electrode is preferably 1,000Ω/□ or less in terms of surface resistivity, it is more preferably 100Ω/□ or less. In order to apply to electric current driving type optoelectronic devices, it is preferably to be 50Ω/□ or less, and it is specifically preferable to be 10Ω/□ or less. When the transparent electrode has an electrical resistance value of 1,000Ω/□ or less, it is preferable since it can be used as a transparent electrode for a various kinds of electric current driving type optoelectronic devices. It is possible to measure the above surface resistivity, for example, based on JIS K7194: 1994 (Test method for resistivity of conductive plastics with a 4-pin probe measurement method) or ASTM D257. Further, it is also possible to conveniently measure the surface resistivity employing a commercially available surface resistivity meter.

The thickness of the transparent electrode of the present invention is not specifically limited, and it is possible to appropriately select the thickness depending on intended purposes. However, commonly the thickness is preferably 10 μm or less. The thickness is more preferably thinner since transparency and transparency are thereby improved in relation to the thickness.

[Transparent Conductive Layer]

The transparent conductive layer of the present invention may contain a transparent binder material and an additive in addition to the conductive fibers and the conductive material. If the transparent binder material is a transparent resin which can form a coating liquid, there is no specific restriction. Examples of the transparent resin include: polyester resin, polystyrene resin, acrylic resin, polyurethane resin, acrylic urethane resin, polycarbonate resin, cellulose resin and butyral resin. These can be used solely, or can be used in combination of two or more.

The thickness of the transparent conductive layer of the present invention varies depending on the shape and content of employed conductive fibers, however as a rough standard, the thickness is preferably the average diameter of conductive fibers or more and 500 nm or less. It is preferable to decrease the thickness of the transparent conductive layer of the present invention with the pressing method which will be described later, because the network of the conductive fibers can be formed dense in the layer thickness direction.

[Surface Smoothness]

In the present invention, Ry and Ra each represents the surface smoothness of the surface of a transparent conductive layer such that Ry=a maximum height (the level difference between a peak portion and a valley portion on a surface) and Ra an arithmetic average roughness, and these are values pursuant to surface roughness specified in JIS B601 (1994). The transparent electrode of the present invention is characterized in that the surface smoothness of the surface of the transparent conductive layer satisfies a conditional formula: Ry≦50 nm. In addition, it is preferable that the surface smoothness of the surface of the transparent conductive layer satisfies a conditional formula: Ra≦5 nm. In the present invention, a commercially-marketed atomic force microscope (AFM) can be used for measurement of Ry and Ra, and for example, the measurement can be conducted in the following ways.

As an AFM, SPI3800N probe station and an SPA400 multifunction type unit manufactured by Seiko Instruments Co., Ltd., are used. The sample cut out in a size of about a 1-cm square is set on a horizontal sample stand on a piezo scanner. Subsequently, a cantilever is made to approach to the surface of the sample, and when the cantilever reaches a region where an atomic force works, the sample is scanned in the XY direction, and the convexo-concave on the surface of the sample is detected as the displacement of the piezo element in the Z direction. Here, in the measurement, preferably employed is a piezo scanner which can scan with 150 μm in the XY direction and 5 μm in the Z direction. As the cantilever, employed is Silicon cantilever SI-DF20 manufactured by Seiko Instruments Co., Ltd. with a resonant frequency of 120 to 150 kHz and a spring constant of 12 to 20 N/m. With the above piezo scanner and the cantilever, the measurement region of 80×80 μm is measured in a DFM mode (Dynamic Force Mode) with a scanning frequency of 1 Hz.

In the present invention, the value of Ry is more preferably 40 nm or less, and still more preferably 30 nm or less. Similarly, the value of Ra is more preferably 3 nm or less, and still more preferably 1 nm or less.

[Conductive Fibers]

The conductive fibers according to the present invention have conductivity, and have a shape with a length long enough as compared with a diameter (thickness). It is considered that the conductive fibers of the present invention form a three-dimensional conductive network when each of conductive fibers contact each other in a transparent conductive layer, and they function as an auxiliary electrode. Therefore, it is preferable to use conductive fibers having a longer length, because it is advantageous to form a conductive network. On the other hand, when conductive fibers become long, conductive fibers become entwined with each other and form an aggregate, so that the entwined conductive fibers may deteriorate optical properties. It is preferable to use conductive fibers having an optimal average aspect ratio (aspect ratio=length/diameter) in accordance with to the conductive fibers to be used, because the rigidity of conductive fibers, a diameter or other properties may affect the formation of the conductive network and aggregate. As a rough standard, an average aspect ratio is preferably 10 to 10,000.

As a shape of conductive fibers, there are a hollow tube shape, a wire shape and a fiber shape. For example, examples of the conductive fibers include organic fibers coated with metal, inorganic fibers, conductive metal oxide fibers, metal nanowires, carbon fibers and carbon nanotubes. In the present invention, it is preferable that the conductive fibers are conductive fibers with a thickness of 300 nm or less from a viewpoint of transparency. In addition, in order to also satisfy conductivity, it is preferable that the conductive fibers are at least one selected from a group consisting of metal nanowires and carbon nanotubes. Furthermore, silver nanowires can be most preferably used from a viewpoint of cost (material cost, production cost) and properties (electro-conductivity, transparency and flexibility).

In the present invention, the length, diameter and average aspect ratio of the above conductive fibers can be measured in such a way that the electron microscope photograph of the sufficient number of conductive fibers is taken and the above values can be obtained from the arithmetic average of the measurement values of respective conductive fibers images. The length of conductive fibers is originally to be measured on a state stretched in a straight line. Actually, in many cases, they are curved. Accordingly, the projected diameter and projected area of each of the nanowires were calculated from the electron microscope photograph by the use of an image analyzing device, and then the length is calculated with the supposition of a cylindrical column (length=projected area/projected diameter). A relative standard deviation of length or diameter is represented with a value obtained by multiplying 100 with a value obtained by dividing the standard deviation value of the measured values by the average value. The number of samples of nanowires to be measured is preferably 100 or more, and is more preferably 300 or more.

Relative standard deviation (%)=(Standard deviation of the measured values/average value)×100

[Metal Nanowires]

Generally, metal nanowires means a linear structure composed of a metallic element as a main structural element. In particular, the metal nanowires in the present invention mean a linear structure having a diameter of from an atomic scale to a nanometer (nm) size.

In order to form a long conductive path by a single metal nanowire, metal nanowires applied to the conductive fibers according to the present invention preferably have an average length of 3 µm or more, more preferably 3 to 500 µm, and still more preferably 3 to 300 µm. In addition, the relative standard deviation of the length of the conductive fibers is preferably 40% or less. Moreover, from a viewpoint of transparency, a average diameter is preferably smaller, on the other hand, from the viewpoint of conductivity, it is preferably larger. In the present invention, the average diameter of metal nanowires is preferably 10 to 300 nm, and more preferably 30 to 200 nm. Further, the relative standard deviation of the diameter is preferably 20% or less.

There is no specific restriction to the metal composition of the metal nanowire of the present invention, and metal nanowires can be composed of one kind or two or more kinds of metals of noble metal elements or less noble metal elements. However, it is preferable that metal nanowires contain at least one kind of metal selected from the group consisting of noble metals (for example, gold, platinum, silver, palladium, rhodium, iridium, ruthenium and osmium), iron, cobalt, copper and tin. It is more preferable that metal nanowires contain at least silver from the viewpoint of conductivity. Moreover, for the purpose of satisfying both conductivity and stability (sulfuration resistance, oxidation resistance and migration resistance of metal nanowires), it is also preferable that metal nanowires contain silver and at least one kind of metal belonging to the noble metal except silver. When the metal nanowires of the present invention contain two or more kinds of metallic elements, metal composition may be different between the surface and the inside of metal nanowires, and the whole metal nanowires may have the same metal composition.

In the present invention, there is no specific restriction to the producing means of metal nanowires, for example, well-known means, such as a liquid phase method and a gas phase method, may be employed. Further, in the specific production method, there is no restriction, and well-known production methods may be employed. For example, as a manufacturing method of Ag nanowires, referred may be Adv. Mater. 2002, 14, 833-837 and Chem. Mater. 2002, 14, 4736-4745; as a manufacturing method of Au nanowires, referred may be JP-A No. 2006-233252; as a manufacturing method of Cu nanowires, referred may be JP-A No. 2002-266007; and as a manufacturing method of Co nanowires, referred may be JP-A No. 2004-149871. Specifically, with the manufacturing method of Ag nanowires reported by Adv. Mater and Chem. Mater, Ag nanowires can be manufactured simply in an aqueous system and the electrical conductivity of silver is largest in all metals. Therefore, the above method can be preferably employed as the manufacturing method of the metal nanowires according to the present invention.

[Carbon Nanotubes]

Carbon nanotubes are a carbon fiber material having a configuration in which graphite-like carbon atom surfaces (graphene seats) with a thickness of several atomic layers are wound in a cylindrical shape. The carbon nanotubes are classified roughly into a single layer nanotube (SWNT) and a multilayer nanotube (MWNT) from the number of peripheral walls constituting tubes. Further, they are classified into a chiral (spiral) type, a zigzag type, and an armchair type from the difference in the structure of a graphene seat. Accordingly, various types of carbon nanotubes are well known.

As carbon nanotubes applicable to the conductive fibers according to the present invention, any types of carbon nanotubes can be employed, and these various carbon nanotubes may be used as a mixture of plural kinds. However, it is preferable to employ a single layer nanotube excellent in electro-conductivity, and further, it is more preferable to employ a metallic armchair type single layer carbon nanotube.

In order to form a long conductive path by a single carbon nanotube, the configuration of the carbon nanotubes of the present invention is preferably to have a large aspect ratio (aspect ratio=length/diameter), namely, it is preferable that the carbon nanotubes are a thin and long single layer carbon nanotube. For example, carbon nanotubes preferably have an aspect ration of $10^2$ or more, more preferably have an aspect ratio $10^3$ or more. An average length of carbon nanotubes is preferably 3 µm or more, and more preferably is 3 to 500 µm, and still more preferably 3 to 300 µm. In addition, the relative standard deviation of the length is preferably to be 40% or less. Further, an average diameter is preferably smaller than 100 nm, more preferably it is 1 to 50 nm, and still more preferably 1 to 30 nm. In addition, the relative standard deviation of the diameter is preferably to be 20% or less.

The production method of the carbon nanotubes employed in the present invention is not limited specifically. It is possible to employ well-known means, such as catalytic hydrogen reduction method of carbon dioxide, arc discharge method, laser evaporating method, CVD method, vapor growth method, and HiPco method in which carbon monoxide is made to react with an iron catalyst at an elevated-temperature with a high pressure and to grow up in a gas phase. Moreover, in order to remove the residues of the reaction, such as byproducts and catalyst metals, it is preferable to highly purify the carbon nanotubes by various refining processes, such as washing method, centrifuge method, filtration, oxidation method, and chromatography, whereby the purified carbon nanotube fully exhibit various functions.

The application amount (content) of the conductive fibers in the transparent electrode of the present invention may change depending on the kind of the employed conductive fibers. However, it is preferably about 0.1 mg/m² to 1000 mg/m², and more preferably about 1 mg/m² to 100 mg/m².

[Transparent Conductive Material]

In the present invention, a transparent conductive material is a material which can form a film having transparency and uniform conductivity at the time of forming the film with this material. As such a transparent conductive material, for example, a conductive polymer, conductive metal oxide particles, metal particles, organic particles and inorganic particles coated with metal may be employed. In the present invention, from the viewpoint of transparency and conductivity, it is preferable that the conductive material is at least one selected from the group consisting of a conductive polymer and conductive metal oxide nanoparticles.

[Conductive Polymer]

Examples of the conductive polymer employed for the transparent conductive material in the present invention include compounds selected from the group consisting of each of the derivatives of: polypyrrole, polyaniline, polythiophene, polythienylene vinylene, polyazulene, polyisothianaphthene, polycarbazole, polyacetylene, polyphenylene, polyphenylene vinylene, polyacene, polyphenyl acetylene and polynaphthalene.

The conductive material of the present invention may contain only one type of a conductive polymer alone or at least two types of conductive polymers in combination. In view of electrical conductivity and transparency, it is more preferable to contain at least one compound selected from the group consisting of polyaniline having the repeated unit represented by the following Formula (I) and/or the following Formula (II) and derivatives thereof, polypyrrole derivatives having the repeated unit represented by the following Formula (III), and polythiophene derivatives having the repeated unit represented by the following Formula (IV).

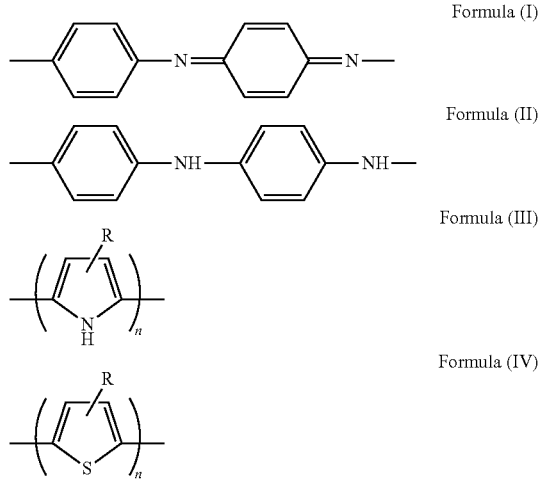

In above Formula (III) and Formula (IV), R is primarily a linear organic substituent, which is preferably an alkyl group, an alkoxy group, or an allyl group, or a combination thereof. Further, these may be combined with a sulfonate group, an ester group, or an amido group or a combination thereof. These may be usable when properties as a soluble conductive polymer are not lost. Still further, "n" is an integer.

The transparent conductive polymers employed in the present invention may be subjected to doping treatment to more enhance electro-conductivity. Examples of the dopant used for conductive polymers include: at least one selected from the group consisting of sulfonic acids (hereinafter referred to as "long chain sulfonic acids") having a hydrocarbon group with 6-30 carbon atoms or polymers thereof (for example, polystyrenesulfonic acid) or derivatives thereof, halogens, Lewis acids, protonic acids, transition metal halides, transition metal compounds, alkaline metals, alkaline earth metals, $MClO_4$ (M=$Li^+$ or $Na^+$), $R_4N^+$ (R=$CH_3$, $C_4H_9$, or $C_6H_5$), or $R_4P^+$ (R=$CH_3$, $C_4H_9$, or $C_6H_5$). Among them, the above long chain sulfonic acid is preferred.

Further, the dopants used for conductive polymers may be introduced into fullerenes such as hydrogenated fullerene, hydroxylated fullerene, or sulfonated fullerene. In the transparent conductive layer of the present invention, the content of the above dopants is preferably 0.001 parts by weight or more to 100 parts by weight of the conductive polymer, is more preferably 0.5 parts by weight or more.

The conductive materials of the present may contain at least one dopant selected from the group consisting of a long chain sulfonic acids, polymers of the long chain sulfonic acid (for example, polystyrenesulfonic acid), halogens, Lewis acids, protonic acids, transition metal halides, transition metal compounds, alkaline metals, alkaline earth metals, $MClO_4$, $R_4N^+$, and $R_4P^+$, together with fullerenes.

As the conductive polymers according to the present invention, conductive polymers modified with metals disclosed in JP-A Nos. 2001-511581, 2004-99640 and 2007-165199 may be employed.

The transparent conductive materials which include conductive polymers according to the present invention may contain water soluble organic compounds. Among the water soluble organic compounds, compounds which exhibit effects to enhance electro-conductivity when being added into a conductive polymer are know and are occasionally called a 2nd dopant (or a sensitizer). There is no specific restriction to the 2nd dopant usable in the present invention, and it is possible to appropriately select them from those known in the art. For example, dimethyl sulfoxide (DMSO), diethylene and other oxygen-containing compounds may be employed.

In the transparent conductive materials containing a conductive polymer according to the present invention, the content of the above 2nd dopant is preferably 0.001 parts by weight or more to 100 parts by weight of the conductive polymer, more preferably 0.01 to 50 parts by weight, and specifically preferably 0.01 to 10 parts by weight.

In order to assure film forming properties and film strength, the transparent conductive materials containing a conductive polymer according to the present invention may contain transparent resin components and additives in addition to the above conductive polymers. If the transparent resin components are compatible with or dispersible as a mixture with the conductive polymers, there is no specific restriction to the transparent resin components. They may be thermally a hardening resin or a thermoplastic resin. Examples of the transparent resin include: polyester resin (e.g., polyethylene terephthalate, polybutylene terephthalate and polyethylene naphthalate), polyimide resin (e.g., polyimide resin and polyamideimide resin), polyamide resin (e.g., polyamide 6, polyamide 6,6, polyamide 12 and polyamide 11), fluororesin (e.g., polyvinylidene fluoride, polyvinyl fluoride, polytetrafluoroethylene, ethylene-tetrafluoroethylene copolymer, polychlorotrifluoroethylene), vinyl resin (e.g., polyvinyl alcohol, polyvinyl ether, polyvinyl butyral, polyvinyl acetate, polyvinyl chloride), epoxy resin, xylene resin, aramid resin, polyurethane resin, polyurea resin, melamine resin, phenol resin, polyether, acrylic resin and copolymers thereof.

[Conductive Metal Oxide Particles]

As the conductive metal oxide of conductive metal oxide particles applied to the transparent conductive material according to the present invention, a well-known transparent metal oxide electrical conductive material can be employed. Examples of the conductive metal oxide include indium oxide, tin oxide, and cadmium oxide which are added with tin, tellurium, cadmium, molybdenum, tungsten, fluorine, zinc, germanium, antimony, and the like as dopant, and zinc oxide and titanium oxide, which are added with aluminium, germanium, and the like as dopant.

Preferable examples of conductive metal oxides include the oxide of a metal selected from indium, zinc, and tin. Specific examples include a metal oxide selected from ITO which dopes tin to indium oxide, AZO or GZO which dope aluminium or gallium to zinc oxide, and ATO or FTO which dope antimony and fluorine to tin oxide.

Further, the shape of the conductive metal oxide particles according to the present invention is preferably nano particles having a mean particle diameter of 1 to 100 nm, more preferably nano particles having a mean particle diameter of 3 to 50 nm.

The transparent conductive layer according to the present invention may contain a transparent binder material and additive. The transparent binder material may be selected widely from natural polymer resins and synthetic polymer resins. Examples of the transparent binder material include transparent thermoplastic resins (for example, polyvinyl chloride, vinyl chloride-acetic acid vinyl copolymer, polymethylmethacrylate, cellulose nitrate, chlorinated polyethylene, chlorinated polypropylene, and vinylidene fluoride); and transparent hardening resins (for example, silicone resins, such as melamine acrylate, urethane acrylate, an epoxy resin, a polyimide resin, and acrylic modified silicate) which is hardened with heat, light, electron rays, and radiation. Examples of the additive, include a plasticizer, stabilizers, such as an antioxidant and a sulfuration inhibitor, a surface active agent; a dissolution accelerator; a polymerization inhibitor; and colorants, such as and a dye and a pigment. Furthermore, from a viewpoint of improving workability, such as a coating ability, the transparent conductive layer may contain solvent (for example, water and organic solvents, such as alcohols, glycols, cellosolves, ketones, esters, ethers, amides and hydrocarbons).

The application amount (content) of the transparent conductive material in the transparent electrode of the present invention may change depending on the kind of the used transparent conductive material. However, it is preferably about 1 mg/m$^2$ to 5000 mg/m$^2$, and more preferably 10 mg/m$^2$ to 1000 mg/m$^2$.

Further, in terms of the relationship with the conductive fibers, the ratio of the application amount (the transparent conductive material/the conductive fibers) is preferably about $10^{-2}$ to $10^3$, and more preferably about $10^{-1}$ to $10^2$.

[Production Method]

There is no specific limitation in the production method of the transparent electrode of the present invention and the control method of the smoothness on the surface of a transparent conductive layer. For example, the following methods may be employed.

Method (I)

After a conductive fiber layer is formed on a transparent base material, the conductive fiber layer is not covered completely, and a layer thickness is precisely controlled such that the smoothness of the surface of a transparent conductive layer becomes 1 nm$\leq$Ry$\leq$50 nm, then a transparent conductive material is over-coated.

Method (II)

A conductive fiber layer is formed on a transparent base material, then a transparent conductive material is over-coated so as to cover completely the conductive fiber layer, and thereafter, the surface is uniformly cut such that the conductive fiber layer appears on the surface and the smoothness of the surface of the transparent conductive layer becomes 1 nm$\leq$Ry$\leq$50 nm.

Method (III)

A transparent conductive layer containing conductive fibers and a transparent conductive material is formed on a mold release surface of a mold releasing base material with the smoothness of the surface being 1 nm$\leq$Ry$\leq$50 nm, and thereafter, the transparent conductive layer is transferred onto a transparent base material.

It may be preferable to employ Method (III) for the production of the transparent electrode of the present invention. With the employment of Method (III), the surface of the transparent conductive layer of the transparent electrode can be smoothed with high degree simply and stably.

As mold-releasing substrates employed in the manufacturing method of the transparent electrode of the present invention, resin substrates and resin films are employed suitably. The above resins are not specifically limited, and it is possible to appropriately select any of those known in the art. For example, appropriately employed are substrates and films which are structured with a single layer or a plurality of layers composed of synthetic resins such as a polyethylene terephthalate resin, a vinyl chloride resin, an acrylic resin, a polycarbonate resin, a polyimide resin, a polyethylene resin, or a polypropylene resin. Further employed may be a glass substrate and a metal substrate. Further, if desired, the surface (the mold-releasing surface) of a mold-releasing substrate may be subjected to surface treatment by being coated with a mold releasing agent such as a silicone resin, a fluororesin, or a wax.

Since the surface of a mold-releasing substrate affects the surface smoothness of the surface of a transparent conductive layer after the transparent conductive layer has been transferred, it is preferable that the mold-releasing substrate has high smoothness, and satisfies specifically 1 nm$\leq$Ry$\leq$50 nm, more preferably Ry$\leq$40 nm, and still more preferably Ry$\leq$30 nm. Further, the mold-releasing substrate satisfies preferably Ra$\leq$5 nm, more preferably Ra$\leq$3 nm, and still more preferably Ra$\leq$1 nm.

There is not specific restriction to the method of forming a transparent conductive layer containing conductive fibers and a transparent conductive material on the mold release surface of a mold release substrate. However, from the viewpoint of the improvement of productivity, the enhancement of electrode qualities such as smoothness and uniformity, and the reduction of environmental load, in order to form the transparent conductive layer, it is preferable to employ liquid phase film forming methods such as coating methods or printing methods. Employable examples of the coating method include: a roller coating method, a bar coating method, a dip coating method, a spin coating method, a casting method, a die coating method, a blade coating method, a bar coating method, a gravure coating method, a curtain coating method, a spray coating method, and a doctor coating method.

Employable examples of the printing method include a letterpress (typographic) printing method, a porous (screen) printing method, a lithographic (offset) printing method, an intaglio (gravure) printing, a spray printing method, and an ink-jet printing method. As preliminary treatment to enhance close contact nature and coatability, if desired, the surface of a mold-releasing base material may be subjected to physical surface treatment such as corona discharge treatment or plasma discharge treatment.

As a concrete method of forming a transparent conductive layer which contains conductive fibers and a conductive material and is excellent in the surface smoothness on a transparent base material, for example, the following processes may be employed.

On a mold-releasing surface of a mold-releasing base material, a conductive network structure made of conductive fibers is formed in such a way that a dispersion liquid of conductive fibers is coated (or printed) and then dried. Subsequently, a dispersion liquid of a transparent conductive material is coated (or printed) on the network structure of the conductive fibers so that the clearance in the network structure of the conductive fibers on the base material surface is impregnated with the transparent conductive material, whereby a transparent conductive layer containing the conductive fibers and the conductive material is formed. Subsequently, on this transparent conductive layer or on another transparent base material, an adhesive layer is provided, and then both the transparent conductive layer and the another transparent base material are pasted with the adhesive layer. After hardening the adhesive layer, when the mold-releasing substrate is peeled off, the transparent conductive layer is transferred to the another transparent base material.

According to this process, since the network structure of conductive fibers is arranged in three dimensions in the transparent conductive material layer, the contact area between the conductive fibers and the conductive material can be increased, the auxiliary electrode function of the conductive fibers can fully be utilized, whereby the transparent conductive layer excellent in conductivity can be formed.

In the above-mentioned process, it is effective as a way of increasing the conductivity of the network structure of the conductive fibers to perform a calendar process and heat treatment so as to improve the adhesion between the conductive fibers after applying and drying the conductive fibers, or to perform plasma treatment so as to reduce the contact resistance between the conductive fibers. Moreover, in the above-mentioned process, hydrophilization treatment such as corona discharge (plasma) treatment may be beforehand carried out onto the mold-releasing surface of the mold-releasing base material.

In the above-mentioned process, the adhesive layer may be provided on the mold-releasing substrate side, or may be provided on the transparent base material side. If an adhesive agent used for the adhesive layer is transparent in the visible region and has transfer ability, there is no specific restriction to the adhesive agent. If it is transparent, it may be a thermosetting resin or thermo plastic resin. Although a thermosetting resin, a ultraviolet curing resin, an electron beam curing resin are employable as examples of a hardening resin, among these hardening resins, since the facility for hardening resin is simple and workability is excellent, it is preferable to use a ultraviolet hardening resin. The ultraviolet hardening resin is a resin which can be hardened through a cross linkage reaction by being irradiated with UV rays, and the component containing a monomer with an ethylenic unsaturated double bond is used preferably. Examples of the hardening resin include: an acrylic urethane resin, a polyester acrylate resin, an epoxy acrylate resin and a polyacrylate resin. In the present invention, it is preferable to use an ultraviolet hardening resin of an acrylic type and an acrylic urethane type as a main component of a binder.

The acrylic urethane resin can be easily obtained by making an acryrate monomer having a hydroxyl group to react with a product generally obtained by the reaction of a polyester polyol with an isocyanate monomer or a prepolymer, herein, examples of the acryrate monomer having a hydroxyl group include: 2-hydroxyethyl acrylate, 2-hydroxyethyl methacrylate (hereafter, in the term "acrylate" it includes both "acrylate" and "methacrylate") and 2-hydroxypropyl acrylate. For example, the compound described in JP-A No. 59-151110 can be used. More specifically, the mixture of 100 part of UNIDIC 17-806 (made by DIC Co., Ltd.) and 1 part of CORONATE L (made by Nippon Polyurethane Industry Co., Ltd.) is used preferably.

Examples of the ultraviolet hardening type polyester acrylates resin include: a compound which is formed easily by the reaction of a polyester polyol with a monomer such as 2-hydroxyethyl acrylate or 2-hydroxy acrylate. The compound described in JP-A No. 59-151112 can be employed.

Examples of the ultraviolet hardening type epoxy acrylate resin include: a compound which can be produced in such a way that epoxy acrylate is made into an oligomer, and then a reactive diluent and a photoinitiator are added in the oligomer so as to cause reaction. The compound described in JP-A No. 1-105738 can be employed.

Specific examples of the ultraviolet hardening type polyol polyacrylate resin include: trimethylolpropane triacrylate, ditrimethylolpropane tetraacrylate, pentaerythritol triacrylate, pentaerythritol tetraacrylate, dipentaerythritol hexaacrylate and alkyl modified dipentaerythritol pentaacrylate.

As a resin monomer, examples of monomers having a single unsaturated double bond include: common monomers, such as methyl acrylate, ethyl acrylate, butyl acrylate, benzyl acrylate, a cyclohexyl acrylate, vinyl acetate and styrene. Examples of monomers having two or more unsaturated double bonds include: ethylene glycol diacrylate, propylene glycol diacrylate, divinylbenzene, 1,4-cyclohexane diacrylate, 1,4-cyclohexyldimethyladiacrylate, trimethylolpropane triacrylate and pentaerythritol tetraacrylate.

Among these, example of a preferable compound to be used as a main component of a binder include: an acrylic actinic-ray hardening resin selected from 1,4-cyclohexane diacrylate, pentaerythritol tetra(meth)acrylate, pentaerythritol tri(meth)acrylate, trimethylolpropane (meth)acrylate, trimethylolethane (meth)acrylate, dipentaerythritol tetra(meth)acrylate, dipentaerythritol penta(meth)acrylate, dipentaerythritol hexa(meth)acrylate, 1,2,3-cyclohexanetetra methacrylate, polyurethane polyacrylate and polyester polyacrylate.

Specific examples of the photoinitiator for these ultraviolet hardening type resins include: benzoin and its derivatives, and acetophenone, benzophenone, hydroxybenzophenone, Michler's ketone, α-amyloxim ester, thioxanthone and their derivatives. The photoinitiator may be used with a photosensitizer. The above-mentioned photoinitiator can also be used as a photosensitizer. Moreover, sensitizers such as n-butylamine, triethylamine and tri-n-butylphosphine can be used when the photoinitiator of an epoxy acrylate is employed. The amount of the photoinitiator or the amount of the photosensitizer used for a ultraviolet curing resin composition is 0.1 to 15 weight parts with respect to 100 weight parts of the composition, and it is preferably 1 to 10 weight parts.

The mold-releasing base substrate on which the transparent conductive layer is formed is pasted (glued) with the transparent base material, the adhesive agent is hardened by being irradiated with UV rays, and thereafter mold-releasing base substrate is peeled off, whereby the transparent conductive layer can be transferred to the transparent base material side by peeling off the mold-releasing base material from the cured adhesive agent. Here, the pasting way is not restricted specifically, and sheet press method or roll press method can be used for the pasting. However, it is preferable to use the roll press method. In the roll press method, a film to be pasted is pressed between a roller and a roller and the rollers are rotated. Since the roll press method can apply pressure uniformly and its manufacturing efficiency is good as compared with a sheet press method, the roll press method can be employed preferably.

[Patterning Method]

The transparent conductive layer according to the present invention can be patterned. There is no specific restriction to the method and process of patterning, and a well-known approach can be applied suitably. For example, after forming the patterned transparent conductive layer on the mold-releasing surface, then by transferring the transparent conductive layer onto a transparent base material, the patterned transparent electrode can be obtained. Specifically, the following methods can be preferably used.

(i) The method in which a transparent conductive layer of the present invention is directly built in a pattern by using a printing method on a mold-releasing base material.

(ii) The method in which a transparent conductive layer of the present invention is uniformly built on a mold-releasing base material followed by carrying out patterning by a conventional photolithographic process.

(iii) The method in which a transparent conductive layer of the present invention is uniformly built on a mold-releasing base material using a conductive material containing a UV curable resin followed by carrying out patterning in the same manner as a photolithographic process.

(iv) The method in which a transparent conductive layer of the present invention is uniformly built a negative pattern using a photoresist which has been provided on a mold-releasing base material, then patterning using a lift off method is earned out.

By using any one of the above-mentioned methods, the patterned transparent electrode of the present invention can be formed by transferring the patterned transparent conductive layer produced on the mold-releasing base material onto a transparent base material.

[Appropriate Application]

The transparent electrode of the present invention has high conductivity and transparency, and it can be used conveniently in the field of various optoelectronic devices such as liquid crystal display elements, organic electroluminescence elements, inorganic electroluminescence elements, electronic papers, organic solar cells, and inorganic solar cells; electromagnetic wave shields and touch panels. Among them, it can be suitably used for an organic electroluminescence element which is severely required the surface smoothness of the surface of a transparent electrode or for a transparent electrode of an organic thin film solar battery element.

EXAMPLES

The present invention is described below with reference to examples, but the present invention is not limited to these. In examples, "part" or "%" may be used. Unless specifically mentioned, each respectively represents "mass part" or "mass %".

(Conductive Fibers and Conductive Material)

In this embodiment, silver nanowires was used as the conductive fibers and PEDOT/PSS (poly(3,4-ethylenedioxythiophene)-poly(styrenesulfonate)) or tin oxide particles was used as the transparent conductive material. As the silver nanowires, with reference to the method described in Adv. Mater., and 2002, 14, 833-837, silver nanowires with an average diameter of 75 nm and an average length of 35 µm were produced. The produced silver nanowires were filtered by an ultrafiltration membrane and washed with water, and the washed silver nanowires were dispersed again in ethanol, whereby a silver nanowire dispersion liquid (the content of silver nanowires being 5 mass %) was prepared. Further, as the dispersion liquid of PEDOT/PSS, BaytronR PH510 (produced by H.C. Starck Corporation) was used, and as the dispersion liquid of tin oxide particles, SN-100D (produced by Ishihara Sangyo Kaisha, Ltd.). Further, in any one of Examples and Comparative Examples, the coating of conductive fibers and a conductive material was conducted by the use of an applicator.

Example 1

Production of a Transparent Electrode

Production of Transparent Electrode TC-10

Inventive Example

A transparent electrode was produced in accordance with the abovementioned desirable producing process of the transparent electrode of the present invention. As a mold releasing base material, a PET film with the surface smoothness Ry=35 nm and Ra=2 nm was used. The surface of the PET film was subjected to corona discharge treatment, thereafter, on the surface of the PET film, the silver nanowire dispersion liquid was coated such that the application amount of silver nanowires became 80 mg/m$^2$, and dried, whereby a silver nanowire network structure was formed.

Furthermore, as the transparent conductive material, a dispersion liquid of PEDOT/PSS containing 5% of DMSO was over-coated on the abovementioned silver nanowire network structure such that a dried layer thickness became 100 nm, and was dried, thereafter the dried layer was subjected to heat treatment at 80° C. for three hours, whereby a transparent conductive layer according to the present invention was formed.

In the abovementioned process, since PEDOT/PSS was impregnated in the clearance in the silver nanowire network structure, both of the silver nanowire and the PEDOT/PSS exist in the transparent conductive layer according to the present invention, and the surface of the transparent conductive layer according to the present invention which comes in contact with a PET film is structured to contain both the silver nanowire and the PEDOT/PSS.

Next, an UV ray hardening type resin (NN803, manufactured by JSR Corporation) was coated as an adhesive layer on a PET film (total light transmittance of 90%) provided with a barrier layer and an easy adhesive layer, and a solvent component was evaporated, thereafter, the transparent conductive layer according to the present invention was pasted on the PET film. Subsequently, the adhesive layer was sufficiently hardened by being irradiated with UV rays, and thereafter, the PET film being the mold releasing base material was peeled off, whereby the transparent conductive layer was transferred onto the PET film and Transparent electrode TC-10 according to the present invention was produced.

Production of Transparent Electrode TC-11

Inventive Example

Transparent electrode TC-11 of the present invention was produced in the same way as TC-10 except that a PET film having the surface smoothness of Ry=10 nm and Ra≦1 nm was used as a mold release base material.

Production of Transparent Electrode TC-12

Inventive Example

Transparent electrode TC-12 of the present invention was produced in the same way as TC-10 except that a dispersion liquid of PEDOT/PSS which did not contain DMSO was used as a transparent conductive material.

Production of Transparent Electrode TC-13

Inventive Example

Transparent electrode TC-13 of the present invention was produced in the same way as TC-11 except that a dispersion liquid of PEDOT/PSS which did not contain DMSO was used as a transparent conductive material.

Production of Transparent Electrode TC-14

Inventive Example

Transparent electrode TC-14 of the present invention was produced in the same way as TC-10 except that a PET film having the surface smoothness of Ry=35 nm and Ra=4 nm was used as a mold release base material.

Production of Transparent Electrode TC-15

Comparative Example

Transparent electrode TC-15 of the comparative example was produced in the same way as TC-10 except that a PET film having the surface smoothness of Ry=53 nm and Ra=3 nm was used as a mold release base material.

Production of Transparent Electrode TC-16

Comparative Example

Transparent electrode TC-16 of the comparative example was produced in the same way as TC-10 except that a PET film having the surface smoothness of Ry=60 nm and Ra=5 nm was used as a mold release base material.

Production of Transparent Electrode TC-17

Comparative Example

A transparent electrode was produced in accordance with an electrode producing method employing conductive fibers based on the conventional technique. The surface of a PET film (total light transmittance of 90%) provided with a barrier layer was subjected to corona discharge treatment, and then, on the surface of the PET film, a silver nanowire dispersion liquid was coated such that the application amount of silver nanowires became 80 mg/m$^2$, and was dried, whereby a silver nanowire network structure was formed.

Furthermore, the abovementioned UV ray hardening type resin was over-coated on the abovementioned silver nanowire network structure, and a solvent component in the resin was evaporated. Thereafter, the resin was sufficiently hardened by being irradiated with UV rays. At this time, the coated amount of the UV my hardening type resin was adjusted such that silver nanowires protrudes from the surface of the resin after being dried.

Subsequently, a dispersion liquid of PEDOT/PSS containing 5% of DMSO was over-coated on the abovementioned UV ray hardening type resin such that a dried layer thickness became 100 nm, and was dried, thereafter, the dried layer was subjected to heat treatment at 80° C. for three hours, whereby Transparent electrode TC-17 of the comparative example was produced.

Production of Transparent Electrode TC-18

Comparative Example

A transparent electrode having a metal grid auxiliary electrode structure based on the conventional technique was produced. On a PET film with the surface smoothness of Ry=35 nm and Ra=2 nm, copper was vapor-deposited in a thin layer, thereafter, a copper grid film with L/S=20 μm/300 μm was produced by use of a photo lithography.

Further, a dispersion liquid of PEDOT/PSS was over-coated on the copper grid film such that a dried layer thickness became 100 nm, and was dried, and thereafter, the dried layer was subjected to heat treatment at 80° C. for three hours, whereby a transparent electrode was produced.

Next, an UV ray hardening type resin was coated as an adhesive layer on a PET film (total light transmittance of 90%) provided with a barrier layer and an easy adhesive layer, and a solvent component was evaporated, thereafter, the above transparent conductive layer composed of the copper grid and the dispersion liquid of PEDOT/PSS was pasted on the PET film. Subsequently, the adhesive layer was sufficiently hardened by being irradiated with UV rays, and thereafter, the PET film being the mold releasing base material was peeled off, whereby the transparent conductive layer was transferred onto the PET film and Transparent electrode TC-18 of the comparative example was produced.

Production of Transparent Electrode TC-19

Comparative Example

A transparent electrode was produced in accordance with an electrode producing method employing conductive fibers based on the conventional technique. The surface of a PET film (total light transmittance of 90%) provided with a barrier layer was subjected to corona discharge treatment, and then, on the surface of the PET film, a silver nanowire dispersion liquid was coated such that the application amount of silver nanowires became 80 mg/m$^2$, and was dried, whereby a silver nanowire network structure was formed.

Furthermore, the abovementioned UV ray hardening type resin was over-coated on the abovementioned silver nanowire network structure, and a solvent component in the resin was evaporated. Thereafter, the resin was sufficiently hardened by being irradiated with UV rays, whereby Transparent electrode TC-19 of the comparative example was produced. At this time, the coated amount of the UV ray hardening type resin was adjusted such that silver nanowires protrudes from the surface of the resin after being dried.

Production of Transparent Electrode TC-20

Comparative Example

A transparent electrode structured with only a transparent conductive material was produced based on the conventional technique. The surface of a PET film (total light transmittance of 90%) which had a surface smoothness of Ry=20 nm and Ra=1 nm and was provided with a barrier layer was subjected to corona discharge treatment, and then, on the surface of the PET film, a dispersion liquid of PEDOT/PSS containing 5% of DMSO was coated as a transparent conductive material such that a dried layer thickness became 100 nm, and was dried, thereafter, the dried layer was subjected to heat treatment at 80° C. for three hours, whereby Transparent electrode TC-20 of the comparative example was produced.

Production of Transparent Electrode TC-21

Comparative Example

Transparent electrode TC-21 of the comparative example was produced in the same way as TC-20 except that a dispersion liquid of PEDOT/PSS which did not contain DMSO was used as a transparent conductive material.

Total light transmittance, surface resistivity, and surface smoothness (Ry) were obtained by the following methods for Transparent electrode TC-10 to TC-21 produced as mentioned above. The results are indicated in Table 1.

[Total Light Transmittance]

Total light transmittance was measured by use of Haze meter HGM-2B produced by Suga Test Instruments Co., Ltd in accordance with JIS K 7361-1: 1997.

[Surface Resistivity]

Surface resistivity was measured by use of Lorestar GP (MCP-T610 type) produced by Mitsubishi Chemical Corporation in accordance with JIS K 7194: 1994.

[Surface Smoothness (Ry)]

Surface smoothness was measured in the abovementioned method by use of AFM (SPI3800N probe station and SPA 400 multifunction type unit produced by Seiko Instruments Inc.) for a cut out sample with a size of about 1 cm square.

TABLE 1

| Sample name | Total light transmittance [%] | Surface resistivity [Ω/□] | Ry [nm] | Ra [nm] |
|---|---|---|---|---|
| TC-10 (Invention) | 84% | 10 | 40 | 3 |
| TC-11 (Invention) | 84% | 10 | 13 | 1 |
| TC-12 (Invention) | 84% | 10 | 39 | 3 |
| TC-13 (Invention) | 84% | 10 | 15 | 1 |
| TC-14 (Invention) | 84% | 10 | 40 | 6 |
| TC-15 (Comparative) | 84% | 10 | 59 | 5 |
| TC-16 (Comparative) | 84% | 10 | 74 | 8 |
| TC-17 (Comparative) | 84% | 35 | 116 | 29 |
| TC-18 (Comparative) | 72% | 0.5 | 47 | 5 |
| TC-19 (Comparative) | 86% | 10 | 188 | 47 |
| TC-20 (Comparative) | 88% | $10^3$ | 26 | 2 |
| TC-21 (Comparative) | 88% | $5 \times 10^6$ | 24 | 2 |

In the results shown in Table 1, from the comparison between TC-10, TC-11 (present invention) and TC-20 (comparative example), it turns out that even in the case that a dispersion liquid of PEDOT/PSS inferior in conductivity was used as a transparent conductive material in a transparent electrode, an excellent conductivity equivalent to TC-19 (comparative example) which employed conductive fibers was obtained in the transparent electrode of the present invention. Further, from the comparison between TC-12, TC-13 (present invention) and TC-21 (comparative example), it turns out that even in the case that a transparent conductive material further inferior in the conductivity was used, the similar effect was obtained. In addition, in TC-18 (comparative example) which employed the metal grid structure of the conventional technique, the large deterioration of the total light transmittance was observed. However, in the transparent electrode of the present invention, the influence of the transmittance deterioration was small.

Further, in TC-17, TC-19 produced based on conventional technology by use of the conductive fibers, and 19 (comparative example), the maximum level difference (difference in height between the highest portion and the lowest portion) of 100 nm or more was caused on the surface of an electrode surface due to silver nanowires protruded from the surface. In contrast, the surface of Transparent electrodes TC-10 to TC-14 produced by the producing method of the present invention exhibits excellent smoothness. Accordingly, it can be judged that the producing method of the present invention is effective in improving the surface smoothness of an electrode employing conductive fibers.

Example 2

Production of Organic Electroluminescence Element (Organic EL Element)

Transparent conductive films TC-10 to TC-21 produced in Example 1 were employed as an anode electrode respectively, and Organic EL elements OEL-10 to OEL-21 were produced in the following ways respectively.

<Formation of Positive Hole Transporting Layer>

A coating liquid for forming a positive hole transporting layer was prepared in such a way that 4,4'-bis[(N-(1-naphthyl)-N-phenylamino)]biphenyl (NPD) of a positive hole transporting material was dissolved in 1,2-dichloroethane such that the content of NPD became 1 mass %. The prepared coating liquid was coated on each of the above anode electrodes by a spin coating apparatus, and then the coating layer was dried at 80° C. for 60 minutes, whereby positive hole transporting layers with a thickness of 40 nm were formed.

<Formation of Light Emitting Layer>

A coating liquid for forming a light emitting layer was prepared in the following ways. Polyvinyl carbazole (PVK) as a host material, and the following tree types of dopants were mixed such that, to the mass of the PVK the content of a red dopant material $Btp_2Ir(acac)$ became 1 mass %, the content of a green dopant material $Ir(ppy)_3$ became 2 mass %, and the content of a blue dopant material $FIr(pic)_3$ became 3 mass %. Then, the resultant mixture was dissolved in 1,2-dichloroethane such that the total solid content of the PVK and the tree types of dopants became 1 mass %.

The prepared coating liquid was coated by a spin coating apparatus on each of the above films provided with the respective positive hole transporting layers, and then the coating layer was dried at 100° C. for 10 minutes, whereby light emission layers with a thickness of 60 nm were formed.

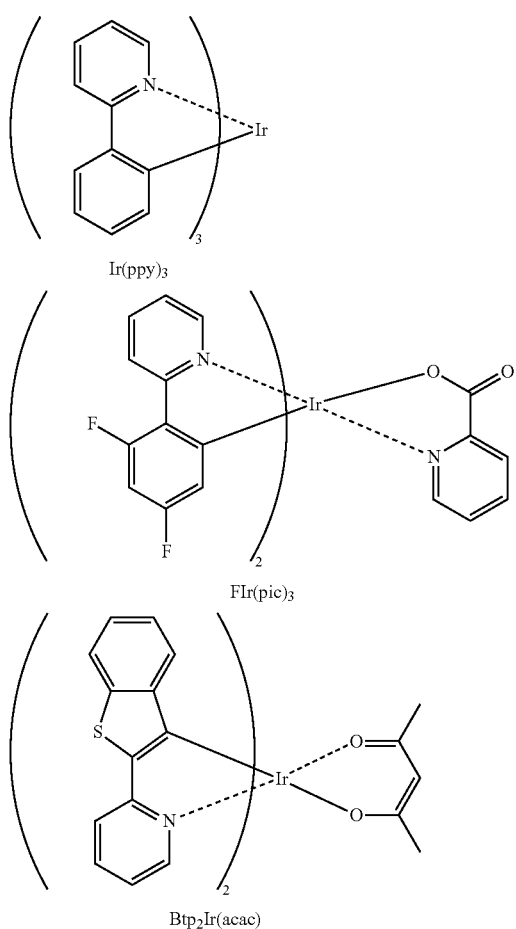

Ir(ppy)₃

FIr(pic)₃

Btp₂Ir(acac)

<Formation of Electron Transporting Layer>

On the formed light emission layers, LiF as an electron transporting layer forming material was vapor-deposited under a vacuum of $5 \times 10^{-4}$ Pa, whereby electron transporting layers with a thickness of 0.5 nm were formed.

<Formation of Cathode Electrode>

On the formed electron transporting layers, aluminum was vapor-deposited under a vacuum of $5 \times 10^{-4}$ Pa, whereby cathode electrodes with a thickness of 100 nm was formed.

<Formation of Sealing Film>

On the formed electron transporting layers, applied was a flexible sealing member in which $Al_2O_3$ was vapor-deposited with a thickness of 300 nm on a polyethylene terephthalate base material. An adhesive was coated on a periphery of the cathode electrode except end portions so as to make it possible to form external terminals of the anode electrode and the cathode electrode, and the flexible sealing member was pasted with the adhesive, thereafter, the adhesive was hardened with heat treatment.

[Unevenness in Brightness of Light Emission]

The produced organic EL elements were made to emit light by being applied with DC voltage by use of Source Major Unit 2400 type manufactured by KEITHLEY Instrument Inc. For each of the organic EL elements OEL-10 to OEL-21 which were emitting light with 200 cd, evenness in light emission was observed by use of a microscope with a magnification of 50 times.

Evaluation Criterion for Evenness in Light Emission

AA: The whole EL elements emitted light evenly.
A: The whole EL elements emitted light almost evenly.
AB: The whole EL elements emitted light almost evenly, but the evenness was inferior to A.
B: Unevenness was slightly observed in the light emission of the EL elements.
BC: Unevenness was slightly observed in the light emission of the EL elements, and the evenness was inferior to B.
C: Unevenness was clearly observed in the light emission of the EL elements.
-: Light emission as an EL element was not observed.

The abovementioned evaluation results are shown in Table 2.

TABLE 2

| EL element name | Anode electrode | Evenness in light emission |
|---|---|---|
| OLE-10 | TC-10 (Invention) | A |
| OLE-11 | TC-11 (Invention) | AA |
| OLE-12 | TC-12 (Invention) | A |
| OLE-13 | TC-13 (Invention) | AA |
| OLE-14 | TC-14 (Invention) | AB |
| OLE-15 | TC-15 (Comparative) | B |
| OLE-16 | TC-16 (Comparative) | BC |
| OLE-17 | TC-17 (Comparative) | — |
| OLE-18 | TC-18 (Comparative) | C |
| OLE-19 | TC-19 (Comparative) | — |
| OLE-20 | TC-20 (Comparative) | — |
| OLE-21 | TC-21 (Comparative) | — |

The reason why OLE-20 and OLE-21 did not emit light was that the resistance value of each of the respective anode electrodes was too high. Further, the cause by which light emission unevenness took place in OLE-14 and OLE-15 and OLE-17 and OLE-19 did not emit light was considered that the smoothness (Ry) of each of their electrode surfaces was insufficient.

On the other hand, in OLE-18 employing TC-18 (comparative example) in which the metal grid structure of the conventional technique was made as the auxiliary electrode, clear periodic light emission unevenness derived from the grid structure was observed. The cause of this unevenness was presumed as follows. That is, for an electrode interval of several nm to several tens nm in the case that a network structure of silver nanowires was made as an auxiliary electrode, a metal grid structure had a larger electrode interval of several hundreds μm. Accordingly, the function of the auxiliary electrode was insufficient for the transparent conductive material inferior in conductivity.

In contrast, in OLE-10 to OLE-14, even light emission was confirmed. Therefore, it can be judged that Transparent electrodes TC-10 to TC-14 of the present invention can be preferably applied as a transparent electrode of an organic EL device. This is because the transparent electrode of the present invention has a sufficiently applicable smoothness even to the usages, such as an organic EL device and an organic thin film solar cell in which the smoothness of an electrode surface is severely required. Further, from the relation in OLE-10, OLE-12, and OLE-14, it turns out that as the smoothness of an electrode surface, the smaller value of Ra is more desirable, Ra≦5 nm is more desirable.

Further, from the relation in OLE-14 and OLE-15, with the employment of the transparent electrode producing method of the present invention using a mold releasing base material with the smoothness of a mold release surface being Ry≦50 nm, it turns out that it become possible to produce a transparent electrode applicable to the usage in which the smoothness of an electrode surface is severely required.

Namely, the transparent electrode of the present invention can provide a light emitting element excellent in light emission evenness.

Example 3

Production of Transparent Electrode TC-31

Inventive Example

TC-31 was produced in the same way as the production method of TC-11 shown in Example 1 except that the transparent conductive material was changed to a dispersion liquid of tin oxide particles and an adjustment was made such that the dried film thickness became 300 nm.

Production of Transparent Electrode TC-41

Inventive Example

TC-41 was produced in the same way as the production method of TC-11 shown in Example 1 except that the conductive fibers was changed to a dispersion liquid of SWCNT (HiPcoR single layer carbon nanotubes manufactured by Unidym Corporation) and an adjustment was made such that the application amount of SWCNT became 10 mg/m2.

The produced transparent electrodes were made as an anode electrode respectively, organic EL elements were produced in the same way as Example 2, and the evaluation was conducted. As a result, it was confirmed that the whole EL elements emitted light evenly as with OLE-11.

TC-31 and TC-41 were made as an anode electrode respectively, organic EL elements were produced in the same way as Example 2, and the evaluation was conducted. As a result, it was confirmed that the whole EL elements emitted light evenly as with OLE-11.

Namely, it turns out that the transparent electrode of the present invention provides a light emitting element excellent in light emission evenness.

EXPLANATION OF REFERENCE SYMBOLS

| 11 | Conductive Fibers |
| 21 | Transparent Conductive Material |
| 31 | Transparent Conductive Layer |
| 41 | Transparent Binder |
| 42 | Transparent Binder Layer |
| 51 | Transparent Base Material |

The invention claimed is:

1. A transparent electrode, comprising:
a transparent base material; and
a transparent conductive layer provided on the transparent base material;
wherein the transparent conductive layer contains conductive fibers and a transparent conductive material, a surface of the transparent conductive layer is structured with a part of the conductive fibers and a part of the transparent conductive material, and the surface of the transparent conductive layer has a smoothness represented by a conditional formula: $1\text{ nm} \leq Ry \leq 50\text{ nm}$, wherein Ry represents a maximum height being a level difference between a peak portion and a valley portion on the surface and is a value corresponding to a surface roughness specified in JIS B601 (1994).

2. The transparent electrode described in claim 1, wherein the conductive fibers are at least one selected from a group consisting of metal nanowires and carbon nanotubes.

3. The transparent electrode described in claim 1, wherein the transparent conductive material is at least one selected from a group consisting of a conductive polymer and conductive metal oxide particles.

4. The transparent electrode described in claim 1, wherein the surface of the transparent conductive layer has an arithmetic average roughness Ra satisfying a conditional formula: $0.1\text{ nm} \leq Ra \leq 5\text{ nm}$, wherein Ra represents an arithmetic average roughness and is a value corresponding to a surface roughness specified in JIS B601 (1994).

5. A method of producing the transparent electrode described in claim 1, comprising the steps of:
forming a transparent conductive layer containing conductive fibers and transparent conductive material on a mold release surface of a mold releasing substrate, wherein the mold release surface having a smoothness represented by a conditional formula: $1\text{ nm} \leq Ry \leq 50\text{ nm}$; and thereafter
transferring the transparent conductive layer onto a transparent base material so that the transparent electrode is formed, wherein Ry represents a maximum height being a level difference between a peak portion and a valley portion on the surface and is a value corresponding to a surface roughness specified in JIS B601 (1994).

* * * * *